(12) United States Patent
Choi et al.

(10) Patent No.: US 7,312,647 B2
(45) Date of Patent: Dec. 25, 2007

(54) MEMORY DEVICE HAVING A DUTY RATIO CORRECTOR

(75) Inventors: Young Bae Choi, Suwon-Shi (KR); Kwang Jin Na, Anyang-Shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 11/623,927

(22) Filed: Jan. 17, 2007

(65) Prior Publication Data

US 2007/0109033 A1    May 17, 2007

Related U.S. Application Data

(62) Division of application No. 11/336,058, filed on Jan. 20, 2006, now Pat. No. 7,190,203, which is a division of application No. 10/878,769, filed on Jun. 28, 2004, now Pat. No. 7,023,254.

(30) Foreign Application Priority Data

Apr. 20, 2004   (KR) ............................... 2004-27096

(51) Int. Cl.
    *H03K 3/017*    (2006.01)
(52) U.S. Cl. .................... 327/175; 327/172
(58) Field of Classification Search .................. None
    See application file for complete search history.

(56) References Cited

U.S. PATENT DOCUMENTS

| | | | |
|---|---|---|---|
| 5,841,305 A | 11/1998 | Wilson | |
| 5,894,176 A * | 4/1999 | Bourekas et al. | 327/198 |
| 6,084,452 A | 7/2000 | Drost et al. | |
| 6,246,278 B1 * | 6/2001 | Anderson et al. | 327/295 |
| 6,448,828 B2 * | 9/2002 | Stark et al. | 327/175 |
| 6,542,015 B2 | 4/2003 | Zhou et al. | |
| 6,566,925 B2 | 5/2003 | Ma | |
| 6,750,689 B2 | 6/2004 | Fletcher et al. | |
| 6,765,421 B2 | 7/2004 | Brox et al. | |
| 6,897,696 B2 | 5/2005 | Chang | |
| 6,897,698 B1 * | 5/2005 | Gheorghiu et al. | 327/231 |
| 6,967,514 B2 | 11/2005 | Kizer et al. | |
| 6,977,539 B1 * | 12/2005 | McDonagh et al. | 327/295 |
| 7,015,739 B2 * | 3/2006 | Lee et al. | 327/175 |
| 7,023,254 B2 | 4/2006 | Choi et al. | |
| 7,151,398 B2 * | 12/2006 | Giguere et al. | 327/291 |
| 7,190,203 B2 | 3/2007 | Choi et al. | |
| 2003/0151435 A1 | 8/2003 | Ma | |
| 2005/0104640 A1 | 5/2005 | Park | |
| 2005/0122149 A1 | 6/2005 | Cho et al. | |
| 2007/0013423 A1 * | 1/2007 | Lee | 327/175 |

* cited by examiner

*Primary Examiner*—Kenneth B. Wells
*Assistant Examiner*—Cassandra Cox
(74) *Attorney, Agent, or Firm*—Marshall, Gerstein & Borun LLP

(57) ABSTRACT

A memory device having a duty ratio corrector which can reduce power consumption by blocking current paths between output terminals and a ground terminal by applying input signals for turning off switching devices for generating an auxiliary voltage for correcting a duty ratio at an initial stage, and which can improve an operational speed by changing the auxiliary voltage from a predetermined voltage, not 0V, to a target voltage.

19 Claims, 5 Drawing Sheets

MEMORY DEVICE HAVING A DUTY RATIO CORRECTOR

CROSS-REFERENCE TO RELATED APPLICATIONS

This application is a divisional of U.S. patent application Ser. No. 11/336,058, filed Jan. 20, 2006 now U.S. Pat. No. 7,190,203, which is a divisional of U.S. patent application Ser. No. 10/878,769 filed Jun. 28, 2004 now U.S. Pat. No. 7,023,254, which relies for priority upon Korean Patent Application No. 2004-0027096 filed on Apr. 20, 2004, the contents of which are herein incorporated by reference in their entirety.

BACKGROUND

1. Field of the Invention

The present patent application relates to a memory device having a duty ratio corrector, and more particularly to, a memory device having a duty ratio corrector which can minimize power consumption and rapidly generate an output signal by blocking current paths in an initial mode.

2. Discussion of Related Art

All memory devices use clock signals. As an operational speed of the memory device increases, a duty ratio of an input clock signal influences performance of the whole chip. Therefore, a duty ratio corrector for maintaining a duty ratio of a clock signal at 50% has been employed.

The operation of the duty ratio corrector will now be described.

FIG. 1 is a concept diagram for explaining the operation of the general duty ratio corrector.

Referring to FIG. 1, the duty ratio corrector basically includes two resistance devices R101 and R102, two switching devices N101 and N102, a current supply means I101 and two capacitors C101 and C102. The coupling structure of the duty ratio corrector will now be explained in more detail.

The first resistance device R101 is coupled between a power voltage terminal VDD and a first output terminal OUT1. The second resistance device R102 is coupled between the power voltage terminal VDD and a second output terminal OUT2. Here, the first and second resistance devices R101 and R102 have the same resistance value.

The first switching device N101 is coupled to the first resistance device R101 and operated according to an inverted clock signal clkb. The second switching device N102 is coupled to the second resistance device R102 and operated according to a clock signal clk.

The current supply means I101 is coupled between the first and second switching devices N101 and N102 and a ground terminal GND, so that a constant current can regularly flow through the first and second resistance devices R101 and R102.

The first capacitor C101 is coupled between the first output terminal OUT1 and the ground terminal GND. When the first switching device N101 is turned on, the first capacitor C101 is charged or discharged by the current flowing through the first resistance device R101 by the current supply means I101. The second capacitor C102 is coupled between the second output terminal OUT2 and the ground terminal GND. When the second switching device N102 is turned on, the second capacitor C102 is charged or discharged by the current flowing through the second resistance device R102 by the current supply means I101.

The operation of the duty ratio corrector will now be described.

FIGS. 2A to 2E are waveform diagrams for explaining the operation of the duty ratio corrector of FIG. 1.

As shown in FIG. 2A, when the clock signal clk is inputted in a higher level than a reference voltage Vref for deciding a high level and a low level and when the inverted clock signal clkb is inputted in a lower level than the reference voltage Vref, as shown in FIG. 2B, a rate of a high level pulse to a low level pulse of a clock pulse clkp or an inverted clock pulse clkpb is changed. In this case, an operational margin is sufficient in a high level but deficient in a low level to generate errors.

When receiving the clock signals clk and clkb, the duty ratio corrector increases the level of the clock signal clk and decreases the level of the inverted clock signal clkb, thereby correcting the rate of the high to low level. This operation will now be explained in more detail.

When the inverted clock signal clkb is inputted to the first switching device N101 in a high level, a turn-on time of the first switching device N101 gets longer than a turn-off time thereof. Accordingly, a time of flowing the current through the first resistance device R101 is relatively long, and thus the first capacitor C101 is more charged than discharged. As depicted in FIG. 2C, a level of a first auxiliary voltage DCC outputted to the first output terminal OUT1 gradually increases. The first auxiliary voltage DCC is added to the inverted clock signal clkb, and thus the level of the inverted clock signal clkb increases as shown in FIG. 2D.

On the other hand, when the clock signal clk is inputted to the second switching device N102 in a low level, a turn-off time of the second switching device N102 gets longer than a turn-on time thereof. Accordingly, a time of flowing the current through the second resistance device R102 is relatively short, and thus the second capacitor C102 is more discharged than charged. As depicted in FIG. 2C, a level of a second auxiliary voltage DCCB outputted to the second output terminal OUT2 gradually decreases. The second auxiliary voltage DCCB is added to the clock signal clk, and thus the level of the clock signal clk decreases as shown in FIG. 2D.

When the level of the clock signal clk decreases and the level of the inverted clock signal clkb increases by the above operation, as shown in FIG. 2E, an intermediate level between the clock signal clk and the inverted clock signal clkb is identical to the level of the reference voltage Vref, and thus the rate of the high to low level is the same.

As described above, the duty ratio corrector is operated according to the clock signal clk and the inverted clock signal clkb which have opposite phases. When receiving the opposite phase signals at the same time, any one of the first switching device N101 and the second switching device N102 must be turned on. Therefore, the current starts to flow in a standby mode or before a normal operation mode, which results in high power consumption.

In addition, when one of the first switching device N101 and the second switching device N102 is turned on, any one of the first auxiliary voltage DCC and the second auxiliary voltage DCCB is outputted as 0V. In order to perform a normal operation, 0V of auxiliary voltage DCC or DCCB must be increased to an target level. However, it takes a long time to increase the auxiliary voltage DCC or DCCB to the target level, and thus takes a long time to correct the duty ratio. As a result, it influences a lock time of a delay locked loop using the same.

SUMMARY OF THE INVENTION

The present invention is directed to a duty ratio corrector which can reduce power consumption by blocking current paths between output terminals and a ground terminal by applying input signals for turning off switching devices for generating an auxiliary voltage for correcting a duty ratio at an initial stage, and which can improve an operational speed by changing the auxiliary voltage from a predetermined voltage, not 0V, to an target voltage, and a memory device having the same.

One aspect of the present invention is to provide a duty ratio corrector having first and second switching devices for generating an auxiliary voltage for correcting a rate of a high to low level of a clock signal, and controlling a current path from a power voltage terminal to a ground terminal according to first and second input signals having opposite phases, the duty ratio corrector including: a first input signal control unit for turning off the first switching device by blocking the first input signal in a standby mode according to a reset signal; and a second input signal control unit for turning off the second switching device by blocking the second input signal in the standby mode according to the reset signal, whereby the current path is blocked in the standby mode, and an output signal is outputted in a higher voltage than 0V.

According to another aspect of the present invention, a duty ratio corrector includes: a first resistance device coupled between a power voltage terminal and a first output terminal; a second resistance device coupled between the power voltage terminal and a second output terminal; a first capacitor coupled between the first output terminal and a ground terminal; a second capacitor coupled between the second output terminal and the ground terminal; a first switching device for controlling a current path from the first resistance device to the ground terminal according to a first input signal; a second switching device for controlling a current path from the second resistance device to the ground terminal according to a second input signal having the opposite phase to that of the first input signal; a first input signal control unit for turning off the first switching device by blocking the first input signal in a standby mode according to a reset signal; and a second input signal control unit for turning off the second switching device by blocking the second input signal in the standby mode according to the reset signal.

Preferably, the first input signal control unit includes: a NAND gate for receiving the reset signal and the first input signal; and an inverter for inverting the output signal from the NAND gate.

Preferably, the second input signal control unit includes: a NAND gate for receiving the reset signal and the second input signal; and an inverter for inverting the output signal from the NAND gate.

According to yet another aspect of the present invention, a memory device having a duty ratio corrector includes: a duty ratio corrector for generating an auxiliary voltage for correcting a rate of a high to low level of a pulse signal by repeatedly charging and discharging a current by a switching operation, switching devices of which being operated according to a first input signal and a second input signal having opposite phases; and a buffer for buffering the first input signal and the second input signal, supplying the buffered signals to the duty ratio corrector, and outputting the first and second input signals for turning off the switching devices in a standby mode according to a reset signal.

Preferably, the buffer includes: a first NAND gate for receiving the reset signal and the first input signal; a first inverter for outputting the first input signal by inverting the output signal from the first NAND gate; a second NAND gate for receiving the reset signal and the second input signal; and a second inverter for outputting the second input signal by inverting the output signal from the second NAND gate.

According to yet another aspect of the present invention, a memory device having a duty ratio corrector includes: a duty ratio corrector for generating an auxiliary voltage for correcting a rate of a high to low level of a pulse signal by repeatedly charging and discharging a current by a switching operation switching devices of which being operated according to a first input signal and a second input signal having opposite phases; and a phase separator for generating the first input signal and the second input signal as input signals, and outputting the first and second input signals for turning off the switching devices in a standby mode according to a reset signal.

Preferably, the phase separator includes: a first NAND gate for receiving the reset signal and the input signal; a first inverter for outputting the first input signal by inverting the output signal from the first NAND gate; a second inverter for inverting the input signal; a second NAND gate for receiving the reset signal and the output signal from the second inverter; and a third inverter for outputting the second input signal by inverting the output signal from the second NAND gate.

Preferably, a capacitor is further installed between an output terminal of the first NAND gate and a ground terminal, for equalizing delay of the first input signal and the second input signal.

Preferably, a transistor being coupled between an output terminal of the second inverter and the ground terminal and having its gate coupled to an input terminal of the second inverter is further installed to improve an operational speed of the second inverter.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Figure 1:
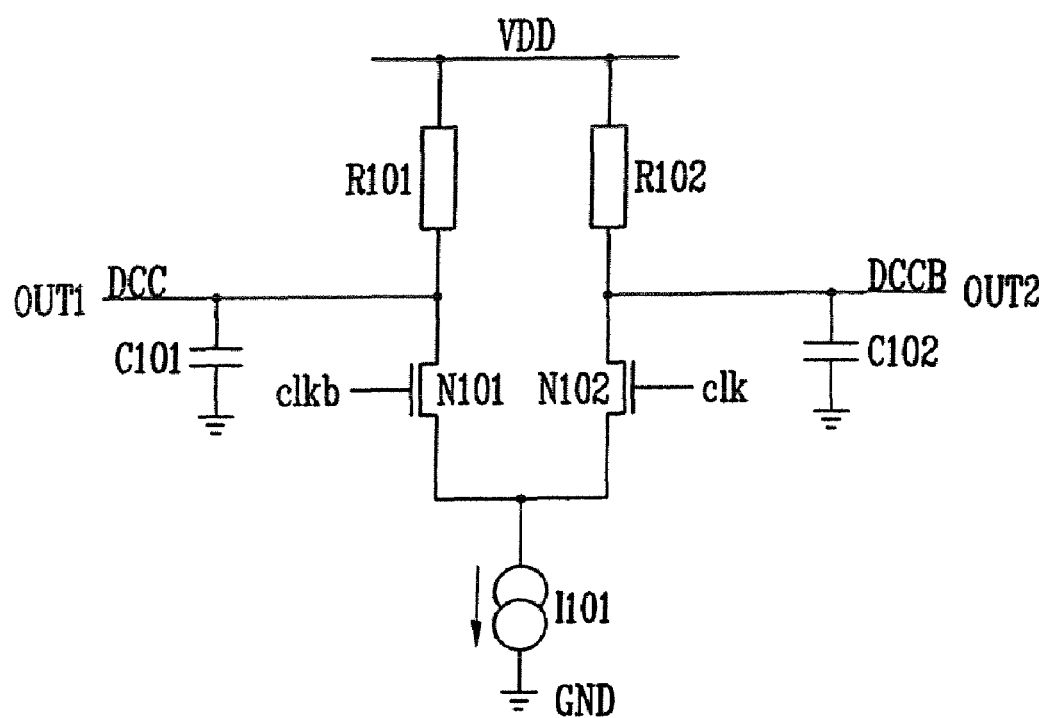
FIG. 1 is a concept diagram for explaining an operation of a general duty ratio corrector.
Figure 2A:
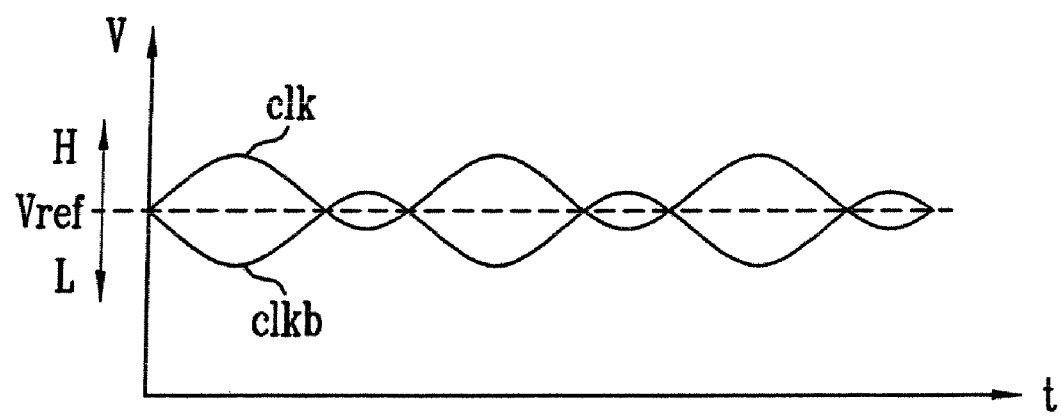
FIGS. 2A to 2E are waveform diagrams for explaining the operation of the duty ratio corrector of FIG. 1.
Figure 2B:
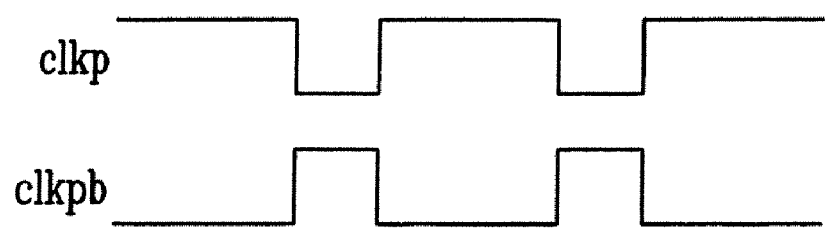
Figure 2C:
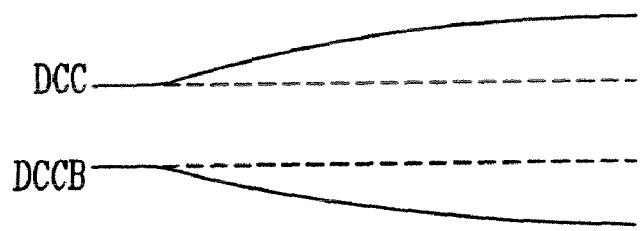
Figure 2D:
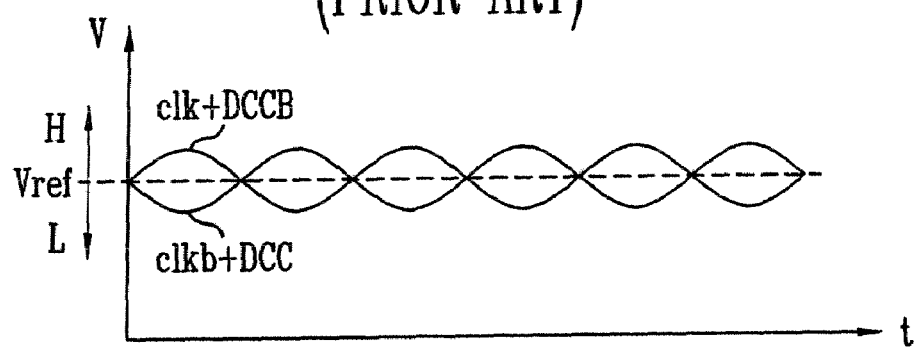
Figure 2E:
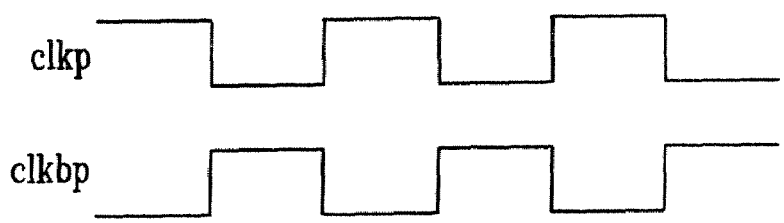

A duty ratio corrector and a memory device having the same in accordance with preferred embodiments of the present invention will now be described in detail with reference to the accompanying drawings. Wherever possible, the same reference numerals will be used throughout the drawings and the description to refer to the same or like parts.

Figure 3:
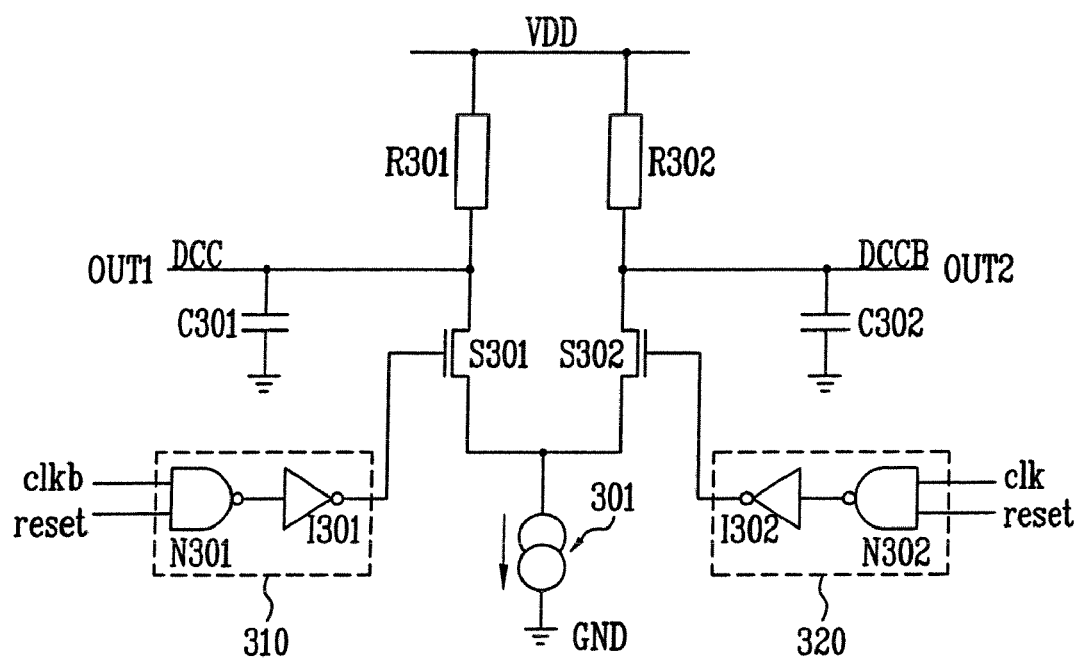
FIG. 3 is a circuit diagram illustrating a duty ratio corrector in accordance with a preferred embodiment of the present invention.

FIG. 3 is a circuit diagram illustrating a duty ratio corrector in accordance with a preferred embodiment of the present invention.

As illustrated in FIG. 3, the duty ratio corrector basically includes two resistance devices R301 and R302, two switching devices S301 and S302, a current supply means 301 and two capacitors C301 and C302, and further includes input signal control units 310 and 320. The coupling structure of the duty ratio corrector will now be explained in more detail.

The first resistance device R301 is coupled between a power voltage terminal VDD and a first output terminal OUT1. The second resistance device R302 is coupled between the power voltage terminal VDD and a second output terminal OUT2. Here, the first and second resistance devices R301 and R302 have the same resistance value.

The first switching device S301 is coupled to the first resistance device R301 and operated according to an inverted clock signal clkb. The second switching device S302 is coupled to the second resistance device R302 and operated according to a clock signal clk. Here, the first band second switching devices S301 and S302 can be designed to have impedance values. In this case, when the switching device is turned on, an initial level of an auxiliary voltage is changed due to voltage distribution with the resistance device coupled in series to the switching device.

The current supply means 301 is coupled between the first and second switching devices S301 and S302 and a ground terminal GND, so that a constant current can regularly flow through the first and second resistance devices R301 and R302. The current supply means 301 can be selectively omitted. When the current supply means 301 is not used, the first switching device S301 is coupled between the first resistance device R301 and the ground terminal GND, and the second switching device S302 is coupled between the second resistance device R302 and the ground terminal GND.

The first capacitor C301 is coupled between the first output terminal OUT1 and the ground terminal GND. When the first switching device S301 is turned on, the first capacitor C301 is charged or discharged by the current flowing through the first resistance device R301 by the current supply means 301. The second capacitor C302 is coupled between the second output terminal OUT2 and the ground terminal GND. When the second switching device S302 is turned on, the second capacitor C302 is charged or discharged by the current flowing through the second resistance device R302 by the current supply means 301.

On the other hand, when the duty ratio corrector is not operated, the first input signal control unit 310 prevents the inverted clock signal clkb from being transmitted to the first switching device S301 according to a reset signal reset. The first input signal control unit 310 includes a NAND orate N301 for receiving the inverted clock signal clkb and the reset signal reset, and an inverter I301 for transmitting the inverted clock signal clkb to the first switching device S301 by inverting the output signal from the NAND gate N301.

When the duty ratio corrector is not operated, the second input signal control unit 320 prevents the clock signal clk from being transmitted to the second switching device S302 according to the reset signal reset. The second input signal control unit 320 includes a NAND gate N302 for receiving the clock signal clk and the reset signal reset, and an inverter I302 for transmitting the clock signal clk to the second switching device S302 by inverting the output signal from the NAND gate N302.

In accordance with the present invention, the duty ratio corrector can reduce power consumption by blocking current paths between the output terminals OUT1 and OUT2 and the ground terminal GND by turning off the switching devices S301 and S302 for generating an auxiliary voltage DCC or DCCB at an initial stage by the first and second input signal control units 310 and 320, and can improve an operational speed by changing the auxiliary voltage DCC or DCCB from a predetermined voltage, not 0V, to an target voltage.

Here, an intermediate voltage between the first auxiliary voltage DCC and the second auxiliary voltage DCCB is determined by distributing the power voltage VDD according to the impedance values of the resistance devices and the switching devices. The level of the first auxiliary voltage DCC and the level of the second auxiliary voltage DCCB can be controlled by correcting the resistance rate thereof, and thus rise or fall of the clock signal clk and the inverted clock signal clkb can also be controlled.

On the other hand, the input signals of the duty ratio corrector are inputted through a phase separator or buffer. When the duty ratio corrector is not operated, the phase separator or buffer can output the input signals according to the reset signal, so that the switching devices for generating the auxiliary voltage can be turned off at an initial stage, FIG. 4 is a circuit diagram illustrating a memory device having a duty ratio corrector in accordance with a first embodiment of the present invention.

Figure 4:
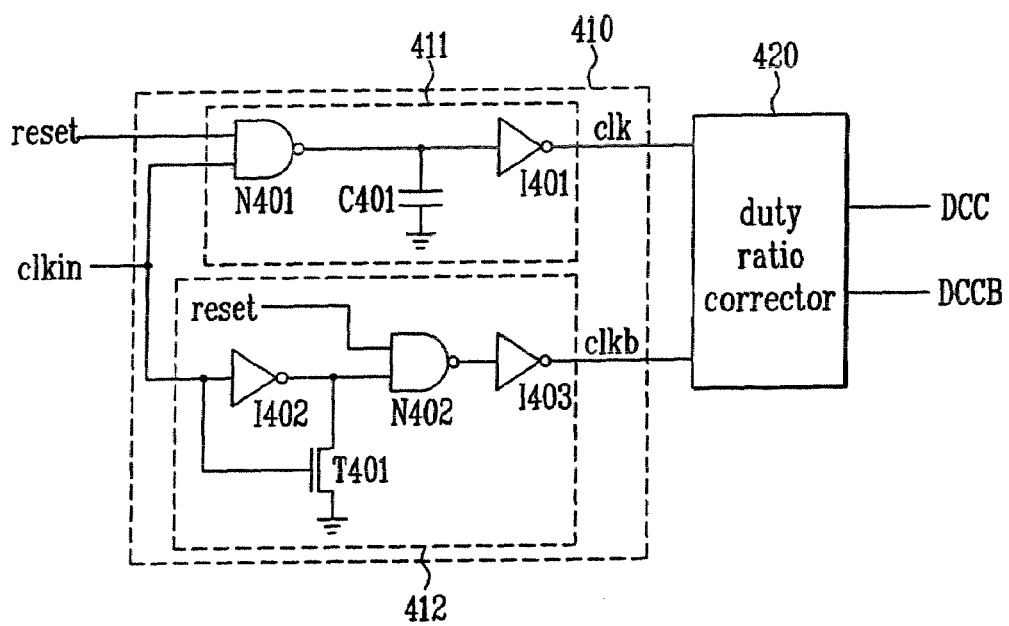
FIG. 4 is a circuit diagram illustrating a memory device having a duty ratio corrector in accordance with a first embodiment of the present invention.

Referring to FIG. 4, when an input signal is one signal such as a clock signal, the memory device includes a phase separator 410 and a duty ratio corrector 420.

The phase separator 410 is divided into a first output unit 411 and a second output unit 412.

The first output unit 411 includes a NAND gate N401 for receiving a reset signal reset for deciding an operation or non-operation of the duty ratio corrector 420 and a clock signal clkin, and an inverter I401 for outputting a clock signal clk by inverting the output signal from the NAND gate N401. Here, a capacitor C401 can be additionally installed between an output terminal of the NAND gate N401 and a ground terminal, for equalizing delay of the clock signal clk and an inverted clock signal clkb generated in the second output unit 412. Accordingly, the first output unit 401 outputs the clock signal clk according to the reset signal reset only when the duty ratio corrector 420 is operated, and outputs a low level signal when the duty ratio corrector 420 is not operated.

The second output unit 412 includes a first inverter I402 for inverting the clock signal clkin, a NAND gate N402 for receiving the reset signal reset for deciding the operation or non-operation of the duty ratio corrector 420 and the output signal from the first inverter I402, and a second inverter I403 for outputting the inverted clock signal clkb by inverting the output signal from the NAND gate N402. Here, a transistor T401 being coupled between an output terminal of the first inverter I402 and the ground terminal and having its gate coupled to an input terminal of the second inverter I402 can be additionally installed to equalize delay of the inverted clock signal clkb and the clock signal clk generated in the first output unit 411 and improve an operational speed by increasing current paths. Therefore, the second output unit 402 outputs the inverted clock signal clkb according to the reset signal reset only when the duty ratio corrector 420 is operated, and outputs a low level signal when the duty ratio corrector 420 is not operated.

The clock signal clk and the inverted clock signal clkb from the phase separator 410 are transmitted respectively to a first switching device (N101 of FIG. 1) and a second switching device (N102 of FIG. 1) of the duty ratio corrector 420, for reducing power consumption by blocking current paths between output terminals OUT1 and OUT2 and the ground terminal when the duty ratio corrector 420 is not operated, and improving an operational speed by changing an auxiliary voltage DCC or DCCB from a predetermined voltage, not 0V, to an target voltage.

Figure 5:
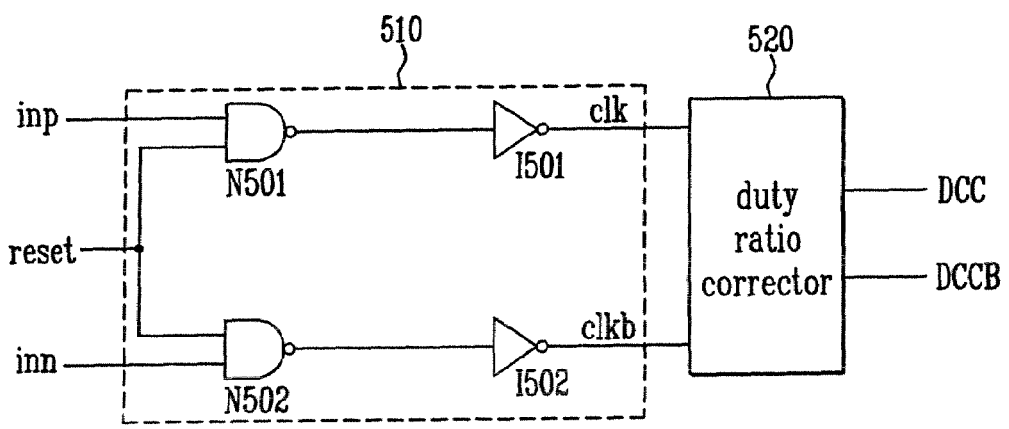
FIG. 5 is a circuit diagram illustrating a memory device having a duty ratio corrector in accordance with a second embodiment of the present invention.

FIG. 5 is a circuit diagram illustrating a memory device having a duty ratio corrector in accordance with a second embodiment of the present invention.

As illustrated in FIG. 5, when input signals are two signals inp and inn having different phases, the memory device includes a buffer 510 and a duty ratio corrector 520.

The buffer 510 includes a first NAND gate N501 for receiving a reset signal reset for deciding an operation or non-operation of the duty ratio corrector 520 and the first input signal inp, a first inverter I501 for outputting a clock signal clk by inverting the output signal from the first NAND gate N501, a second NAND gate N502 for receiving the reset signal reset and the second input signal inn, and a second inverter I502 for outputting an inverted clock signal clkb by inverting the output signal from the second NAND gate N502.

Accordingly, the buffer 510 outputs the clock signal clk and the inverted clock signal clkb according to the reset signal reset only when the duty ratio corrector 520 is operated, and outputs a low level signal when the duty ratio corrector 520 is not operated.

The clock signal clk and the inverted clock signal clkb from the buffer 510 are transmitted respectively to a first switching device (N101 of FIG. 1) and a second switching device (N102 of FIG. 1) o f the duty ratio corrector 520, for reducing power consumption by blocking current paths between output terminals OUT1 and OUT2 and a ground terminal when the duty ratio corrector 520 is not operated, and improving the operational speed by changing an auxiliary voltage DCC or DCCB from a predetermined voltage, not 0V, to an target voltage.

As discussed earlier, in accordance with the present invention, the duty ratio corrector and the memory device having the same can reduce power consumption by blocking the current paths between the output terminals and the ground terminal by applying the input signals for turning off the switching devices for generating the auxiliary voltage for correcting the duty ratio at an initial stage, and can improve the operational speed by changing the auxiliary voltage from a predetermined voltage, not 0V, to the target voltage.

Although the present invention has been described in connection with the embodiments of the present invention illustrated in the accompanying drawings, it is not limited thereto. It will be apparent to those skilled in the art that various substitutions, modifications and changes may be made thereto without departing from the scope and spirit of the invention.

What is claimed is:

1. A memory device, comprising:
  a duty ratio corrector for generating an auxiliary voltage for correcting a rate of a high to low level of a pulse signal by repeatedly charging and discharging a current by a switching operation, switching devices which are operated according to a first input signal and a second input signal; and
  a phase separator for generating the first input signal and the second input signal as input signals, and outputting the first and second input signals for turning off the switching devices in a standby mode during a first level of a reset signal, wherein a phase of the first input signal is opposite to that of the second input signal during a second level of the reset signal.

2. The memory device of claim 1, wherein the phase separator comprises:
  a first NAND gate for receiving the reset signal and an input signal;
  a first inverter for outputting the first input signal by inverting an output signal of the first NAND gate;
  a second inverter for inverting the input signal;
  a second NAND gate for receiving the reset signal and the output signal from the second inverter; and
  a third inverter for outputting the second input signal by inverting an output signal of the second NAND gate.

3. The memory device of claim 2, wherein a capacitor is further installed between an output terminal of the first NAND gate and a ground terminal, for equalizing delay of the first input signal and the second input signal.

4. The memory device of claim 2, wherein a transistor being coupled between an output terminal of the second inverter and a ground terminal and having its gate coupled to an input terminal of the second inverter is further installed to improve an operational speed of the second inverter.

5. A memory device, comprising:
  a duty ratio corrector for generating an auxiliary voltage for correcting a rate of a high to low level of a pulse signal according to a first input signal and a second input signal; and
  a phase separator for generating the first and the second input signals as the same phase for resetting the duty ratio corrector in response to a reset signal.

6. The memory device of claim 5, wherein the phase separator generates the first input signal and the second input signal as input signals in response to the reset signal, a clock signal and an inverted signal of the clock signal.

7. The memory device of claim 5, wherein the auxiliary voltage is generated by repeatedly charging and discharging a current by a switching operation, switching devices of which being operated according to the first input signal and the second input signal.

8. The memory device of claim 5, wherein the phase separator outputs the first and the second input signals for turning off switching devices in a standby mode according to the reset signal.

9. The memory device of claim 5, wherein the phase separator comprises:
  a first NAND gate for receiving the reset signal and a clock signal;
  a first inverter for outputting the first input signal by inverting an output signal of the first NAND gate;
  a second inverter for inverting the clock signal;
  a second NAND gate for receiving the reset signal and an output signal of the second inverter; and
  a third inverter for outputting the second input signal by inverting an output signal of the second NAND gate.

10. The memory device of claim 9, wherein a capacitor is further installed between an output terminal of the first NAND gate and a ground terminal, for equalizing delay of the first input signal and the second input signal.

11. The memory device of claim 9, wherein a transistor being coupled between an output terminal of the second inverter and a ground terminal and having its gate coupled to an input terminal of the second inverter is further installed to improve an operational speed of the second inverter.

12. The memory device of claim 1, wherein the first level of the reset signal is HIGH level, and the second level of the reset signal is LOW level.

13. A memory device, comprising:
   a duty ratio corrector for generating an auxiliary voltage for correcting a rate of a high to low level of a pulse signal according to a first input signal and a second input signal; and
   a phase separator having a first output unit for generating the first input signal in response to a reset signal and an input signal and a second output unit for generating the second input signal in response to the reset signal and the input signal.

14. The memory device of claim 13, wherein the auxiliary voltage is generated by repeatedly charging and discharging a current by a switching operation, switching devices which are operated according to the first input signal and the second input signal.

15. The memory device of claim 13, wherein the phase separator outputs the first and the second input signals for turning off switching devices in a standby mode according to the reset signal.

16. The memory device of claim 13, wherein the first output unit comprises:
   a first NAND gate for receiving the reset signal and the input signal; and
   a first inverter for outputting the first input signal by inverting an output signal of the first NAND gate.

17. The memory device of claim 13, wherein the second output unit comprises:
   a second inverter for inverting the input signal;
   a second NAND gate for receiving the reset signal and an output signal of the second inverter; and
   a third inverter for outputting the second input signal by inverting an output signal of the second NAND gate.

18. The memory device of claim 16, wherein a capacitor is further installed between an output terminal of the first NAND gate and a ground terminal, for equalizing delay of the first input signal and the second input signal.

19. The memory device of claim 17, wherein a transistor is coupled between an output terminal of the second inverter and a ground terminal and having its gate coupled to an input terminal of the second inverter is further installed to improve an operational speed of the second inverter.

* * * * *